(12) United States Patent
Ren

(10) Patent No.: US 11,804,355 B2
(45) Date of Patent: Oct. 31, 2023

(54) APPARATUS FOR MULTIPLE CHARGED-PARTICLE BEAMS

(71) Applicant: ASML Netherlands B.V., Veldhoven (NL)

(72) Inventor: Yan Ren, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 258 days.

(21) Appl. No.: 17/418,749

(22) PCT Filed: Nov. 26, 2019

(86) PCT No.: PCT/EP2019/082634
§ 371 (c)(1),
(2) Date: Jun. 25, 2021

(87) PCT Pub. No.: WO2020/135963
PCT Pub. Date: Jul. 2, 2020

(65) Prior Publication Data
US 2022/0068587 A1  Mar. 3, 2022

Related U.S. Application Data

(60) Provisional application No. 62/786,259, filed on Dec. 28, 2018.

(51) Int. Cl.
*H01J 37/05* (2006.01)
*H01J 37/28* (2006.01)

(52) U.S. Cl.
CPC .............. *H01J 37/05* (2013.01); *H01J 37/28* (2013.01); *H01J 2237/0453* (2013.01);
(Continued)

(58) Field of Classification Search
CPC .. H01J 37/00; H01J 37/02; H01J 37/05; H01J 37/26; H01J 37/28; H01J 2237/0453;
(Continued)

(56) References Cited

U.S. PATENT DOCUMENTS 9,035,249 B1 * 5/2015 Frosien ................. H01J 37/244
250/311
2014/0065547 A1 * 3/2014 Arita ................... H01J 37/3177
430/296
2017/0316912 A1 * 11/2017 Zeidler ................... H01J 37/05

FOREIGN PATENT DOCUMENTS

EP  2267752 A2  12/2010
EP  2267752 A3  4/2012
(Continued)

OTHER PUBLICATIONS

International search report in PCT Application No. PCT/EP2019/082634, dated Feb. 17, 2020 (6 pages).
(Continued)

*Primary Examiner* — Jason L McCormack
(74) *Attorney, Agent, or Firm* — Finnegan, Henderson Farabow, Garrett & Dunner, LLP

(57) ABSTRACT

Systems and methods of observing a sample in a multi-beam apparatus are disclosed. The multi-beam apparatus may include an electron source configured to generate a primary electron beam, a pre-current limiting aperture array comprising a plurality of apertures and configured to form a plurality of beamlets from the primary electron beam, each of the plurality of beamlets having an associated beam current, a condenser lens configured to collimate each of the plurality of beamlets, a beam-limiting unit configured to modify the associated beam current of each of the plurality of beamlets, and a sector magnet unit configured to direct each of the plurality of beamlets to form a crossover within or at least near an objective lens that is configured to focus each of the plurality of beamlets onto a surface of the sample and to form a plurality of probe spots thereon.

15 Claims, 9 Drawing Sheets

(52) U.S. Cl.
CPC . *H01J 2237/055* (2013.01); *H01J 2237/1205* (2013.01); *H01J 2237/24592* (2013.01)

(58) Field of Classification Search
CPC ......... H01J 2237/055; H01J 2237/1205; H01J 2237/24592; H01J 2237/1523; H01J 2237/2811; H01J 2237/2817
USPC .............................. 250/305, 306, 307, 311
See application file for complete search history.

(56) References Cited

FOREIGN PATENT DOCUMENTS

| | | |
|---|---|---|
| EP | 2701178 A2 | 2/2014 |
| EP | 2879155 A1 | 6/2015 |
| EP | 2701178 A3 | 6/2017 |
| TW | 201830150 A | 8/2018 |
| TW | 201841186 A | 11/2018 |
| WO | WO 2017/015483 A1 | 1/2017 |

OTHER PUBLICATIONS

Taiwan Office Action issued in corresponding Application No. 108144866, dated Aug. 10, 2020 (14 pages).

\* cited by examiner

APPARATUS FOR MULTIPLE CHARGED-PARTICLE BEAMS

CROSS-REFERENCE TO RELATED APPLICATIONS

This application claims priority to International Application No. PCT/EP2019/082634, filed Nov. 26, 2019, and published as WO 2020/135963, which claims priority of U.S. application 62/786,259 which was filed on Dec. 28, 2018. The contents of these applications are incorporated herein by reference in their entireties.

TECHNICAL FIELD

The embodiments provided herein disclose a multi-beam apparatus, and more particularly a multi-beam electron microscope including a beam-limiting aperture array to, for example, mitigate Coulomb interaction effects.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more and more important. Although higher beam currents may be used to increase the throughput; however, spatial imaging resolution may be compromised, rendering the inspection tools inadequate for their desired purpose.

Thus, related art systems face limitations in, for example, spatial image resolution due to significant coulomb interaction effects, alignment and noise shielding of electro-optic components. Further improvements in the art are desired.

SUMMARY

In one aspect, the present disclosure is directed to a multi-beam apparatus for observing a sample. The multi-beam apparatus may include an electron source configured to generate a primary electron beam, a pre-current limiting aperture array comprising a plurality of apertures and configured to form a plurality of beamlets from the primary electron beam, each of the plurality of beamlets having an associated beam current, a condenser lens configured to collimate each of the plurality of beamlets, a beam-limiting unit configured to modify the associated beam current of each of the plurality of beamlets, and a sector magnet unit configured to direct each of the plurality of beamlets to form a crossover within or at least near an objective lens that is configured to focus each of the plurality of beamlets onto a surface of the sample and to form a plurality of probe spots thereon. The beam-limiting unit may be further configured to focus each of the plurality of beamlets on a focal plane. The multi-beam apparatus may also include a beam-deflector array having a plurality of beam-deflectors disposed in the focal plane, and each of the plurality of beam deflectors may be associated with a corresponding beamlet of the plurality of beamlets. The plurality of beam deflectors may comprise a multi-pole structure.

The multi-beam apparatus may further include an electron detection device with a plurality of detection elements configured to detect a plurality of secondary electron beams generated from the plurality of probe spots on the sample. The sector magnet unit may be configured to direct the plurality of secondary electron beams generated from the plurality of probe spots to the electron detection device. The beam-limiting unit may include a first micro-lens array comprising a first plurality of apertures, a second micro-lens array comprising a second plurality of apertures, and a current-limiting aperture array comprising a third plurality of apertures, wherein the third plurality of apertures are smaller in diameter than the first and the second plurality of apertures. The plurality of apertures of the pre-current limiting aperture array may be smaller in diameter than the third plurality of apertures of the current-limiting aperture array. The current-limiting aperture array may be disposed between the first and the second micro-lens arrays. The first and the second micro-lens arrays may comprise one of micro-electromechanical systems (MEMS) optics or laser-machined optics. The ratio of modified beam current to the associated beam current of each of the plurality of beamlets may be in the range of 2 to 200.

In another aspect, the present disclosure is directed to a multi-beam apparatus comprising a beam-limiting unit configured to receive a plurality of beamlets generated from a primary electron beam. The beam-limiting unit may include a first micro-lens array comprising a first plurality of apertures, a second micro-lens array comprising a second plurality of apertures, and a current-limiting aperture array comprising a third plurality of apertures, wherein the third plurality of apertures are smaller in diameter than the first and the second plurality of apertures. The multi-beam apparatus may further include a sector magnet unit configured to direct the plurality of beamlets to form a crossover within or at least near an objective lens, the objective lens configured to focus each of the plurality of beamlets onto a surface of the sample and form a plurality of probe spots thereon.

The multi-beam apparatus may include a pre-current limiting aperture array having a plurality of apertures and configured to form a plurality of beamlets from the primary electron beam, each of the plurality of beamlets having an associated beam current. The beam-limiting unit may be configured to modify the associated beam current of each of the plurality of beamlets, and focus each of the plurality of beamlets on a focal plane. The multi-beam apparatus may further include an electron source configured to generate the primary electron beam, a condenser lens configured to collimate the plurality of beamlets, an electron detection device with a plurality of detection elements configured to detect a plurality of secondary electron beams generated from the plurality of probe spots on the sample, and a beam-deflector array having a plurality of beam-deflectors disposed in the focal plane, and each of the plurality of beam deflectors may be associated with a corresponding beamlet of the plurality of beamlets. The plurality of beam deflectors may comprise a multi-pole structure.

The sector magnet unit may be further configured to direct a plurality of secondary electron beams generated from the plurality of probe spots to the electron detection device, and separate the plurality of beamlets incident on the surface of the sample from the plurality of secondary electron beams. The plurality of apertures of the pre-current limiting aperture array may be smaller in diameter than the third plurality of apertures of the current-limiting aperture array. The current-limiting aperture array may be disposed between the first and the second micro-lens arrays. The first and the second micro-lens arrays may comprise one of micro-electromechanical systems (MEMS) optics or laser-machined optics.

The ratio of modified beam current to the associated beam current of each of the plurality of beamlets may be in the range of 2 to 200.

In yet another aspect, the present disclosure is directed to a method of observing a sample using a multi-beam apparatus. The method may include forming a plurality of beamlets from a primary electron beam by a pre-current limiting aperture array, each of the plurality of beamlets having an associated beam current, collimating each of the plurality of beamlets by a condenser lens, modifying the associated beam current of each of the plurality of beamlets by a beam-limiting unit, and directing the plurality of beamlets to form a crossover within or at least near an objective lens by a sector magnet unit, the objective lens configured to focus each of the plurality of beamlets onto a surface of the sample and form a plurality of probe spots thereon.

The method may further include directing a plurality of secondary electron beams generated from the plurality of probe spots to an electron detection device by the sector magnet unit, the electron detection device comprising a plurality of detection elements configured to detect the plurality of secondary electron beams, and focusing each of the plurality of beamlets on a focal plane by the beam-limiting unit.

The method of observing a sample using multi-beam apparatus may include a beam-limiting unit. The beam-limiting unit may include a first micro-lens array comprising a first plurality of apertures, a second micro-lens array comprising a second plurality of apertures, and a current-limiting aperture array comprising a third plurality of apertures, wherein the third plurality of apertures are smaller in diameter than the first and the second plurality of apertures. The sector magnet unit may be configured to separate the plurality of beamlets incident on the surface of the sample from the secondary electron beams, and the beam-deflector array having a plurality of beam deflectors may be disposed in the focal plane, and each of the beam deflectors may be configured to direct a corresponding beamlet of the plurality of beamlets to the sector magnet unit.

In yet another aspect, the present disclosure may be directed to a non-transitory computer readable medium storing a set of instructions that is executable by one or more processors of a multi-beam apparatus to cause the multi-beam apparatus to perform a method to observe a sample. The method may include forming a plurality of beamlets from a primary electron beam by a pre-current limiting aperture array, each of the plurality of beamlets having an associated beam current, modifying the associated beam current of each of the plurality of beamlets by a beam-limiting unit, directing the plurality of beamlets to form a crossover within or at least near an objective lens by a sector magnet unit, the objective lens configured to focus each of the plurality of beamlets onto a surface of the sample and form a plurality of probe spots thereon, and directing a plurality of secondary electron beams generated from the plurality of probe spots to an electron detection device by the sector magnet unit, the electron detection device comprising a plurality of detection elements configured to detect the plurality of secondary electron beams. The set of instructions may further cause the multi-beam apparatus to collimate the plurality of beamlets by a condenser lens, and focus each of the plurality of beamlets on a focal plane by the beam-limiting unit.

DETAILED DESCRIPTION

Figure 1:
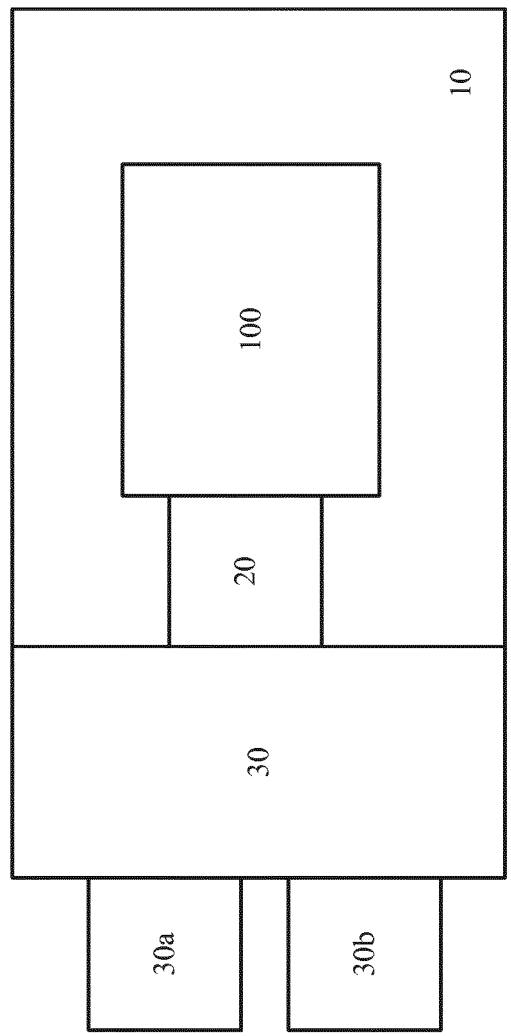
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

As the geometries shrink and the IC chip industry migrates to three-dimensional (3D) architectures (such as, NAND gates, Fin field-effect transistors (FinFETs), and advanced dynamic random-access memory (DRAM), finding defects is becoming more challenging and expensive at each lower node. While high process yield is desirable in an IC chip manufacturing facility, it is also essential to maintain a high wafer throughput, defined as the number of wafers processed per hour. High process yields, and high wafer throughput can be impacted by the presence of defects, especially when operator intervention is involved. Thus, detection and identification of micro and nano-sized defects by inspection tools (such as, a SEM) may be essential for maintaining high yields, high throughput and low cost.

Semiconductor chips are fabricated in an extremely clean and controlled environment that has a very low level of pollutants such as dust, airborne particles, aerosol particles, and chemical vapors. More specifically, a semiconductor cleanroom is required to have a controlled level of contamination that is specified by the number of particles per cubic foot at a specified particle size. A typical chip manufacturing cleanroom contains 1-10 particles per cubic foot of air, each particle being less than 5 um in diameter. For comparison, the ambient air outside in a typical city environment contains approximately 1.25 billion particles per cubic foot, each particle having an average size of ~200 um in diameter. A speck of dust as small as 1 um, on a wafer in process may span across thousands of transistors located on the chip, which could potentially render the entire chip useless. In some cases, a speck of dust on a reticle or a photomask that is used to create repeating patterns on the wafer may cause recurring physical or electrical defects. For example, one or more metal wires connecting transistors in a single chip may overlap or may be undesirably connected through the dust particle, causing a short in the circuit throughout the entire chip.

Although a multiple charged-beam particle imaging system, such as a multi-beam SEM, may be useful in increasing the wafer inspection throughput, the spatial and lateral resolution of multi-beam SEM may be affected by the Coulomb interaction effects that are introduced by large beam currents. In order to achieve high resolution, it is desirable that the beam contain as many electrons as possible. However, due to the repulsive Coulomb interaction between electrons, it is difficult to confine a large number of electrons in a very small volume. Moreover, these interactions may broaden the width of the beam and change the direction of the flight of electrons. As a result, the probe spot will be larger, thus impacting the overall resolution of the SEM. It is desirable for maintaining high resolution of multi-beam SEMs to mitigate the Coulomb interaction effects.

In a conventional SEM, one of the ways to control beam current is to employ two or more condenser lenses, one of which may be movable. The use of two or more condenser lenses not only increases the length and the complexity of the SEM column, but also makes it difficult to align the lenses and shield them from internal as well as external noise. Some embodiments of the present disclosure provide a multi-beam apparatus including only one condenser lens, enabling a reduction in the height of SEM column. In addition, the single condenser lens may not be moved, unlike in a conventional SEM, allowing for easy alignment and noise-shielding.

In addition, in currently existing SEMs, a high voltage is applied to the micro-electromechanical system (MEMS) optics layers to control beam current. Due to the small distances between the control lines, the high voltages applied result in high electric fields which could cause arcing and eventually render the lens ineffective. Some embodiments of the present disclosure provide a method to control beam current by using a micro-lens array downstream of condenser lens, allowing the beam current to be controlled by reasonably acceptable and safe electric field of 1-2 KV/mm.

In one aspect of the present disclosure, a multi-beam apparatus including a pre-current limiting aperture array may be used to mitigate Coulomb interaction effects. The pre-current limiting aperture array may include a plurality of apertures to form a plurality of beamlets from a primary electron source. A condenser lens may collimate the beamlets and a beam-limiting unit including a current-limiting aperture array may modify the beam current associated with each of the collimated beamlets prior to being directed into a sector magnet unit. The sector magnet unit may be configured to then direct each of the plurality of beamlets to form a crossover within or at least near an objective lens, and to direct the plurality of secondary electron beams generated from the plurality of probe spots on the sample to an electron detection device. The apertures of the pre-current limiting aperture array may be smaller in diameter than the apertures of the current-limiting aperture array in the beam-limiting unit.

The utilization of the pre-current limiting aperture array and the beam-limiting unit to adjust beam currents may mitigate Coulomb interaction effects and maintain high resolution. The probe beam current may be adjusted based on the pre-current limiting aperture array instead of relying on the condenser lens. The sector magnet unit may be configured such that it separates the primary beamlets incident on the surface of the sample from the secondary beams generated from the probe spots and directs the secondary beam to the electron detection device. The primary beamlets that are directed to the surface of the sample are directed such that they are incident on the surface of the sample. Some of the other advantages of the claimed multi-beam apparatus include, but are not limited to, simpler structure, easier operation, reduced Coulomb interaction effects, high spatial resolution, improved alignment and noise shielding, and high wafer-inspection throughput.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 1 includes a main chamber 10, a load/lock chamber 20, an electron beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load/lock chamber 20.

Load/lock chamber 20 is connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 100. Main chamber 100 is connected to a main chamber vacuum pump system (not shown), which removes gas molecules in main chamber 100 to reach a second pressure below the first pressure. After reaching the second pressure, the wafer is subject to inspection by electron beam tool 100. While the present disclosure provides examples of main chamber 100 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
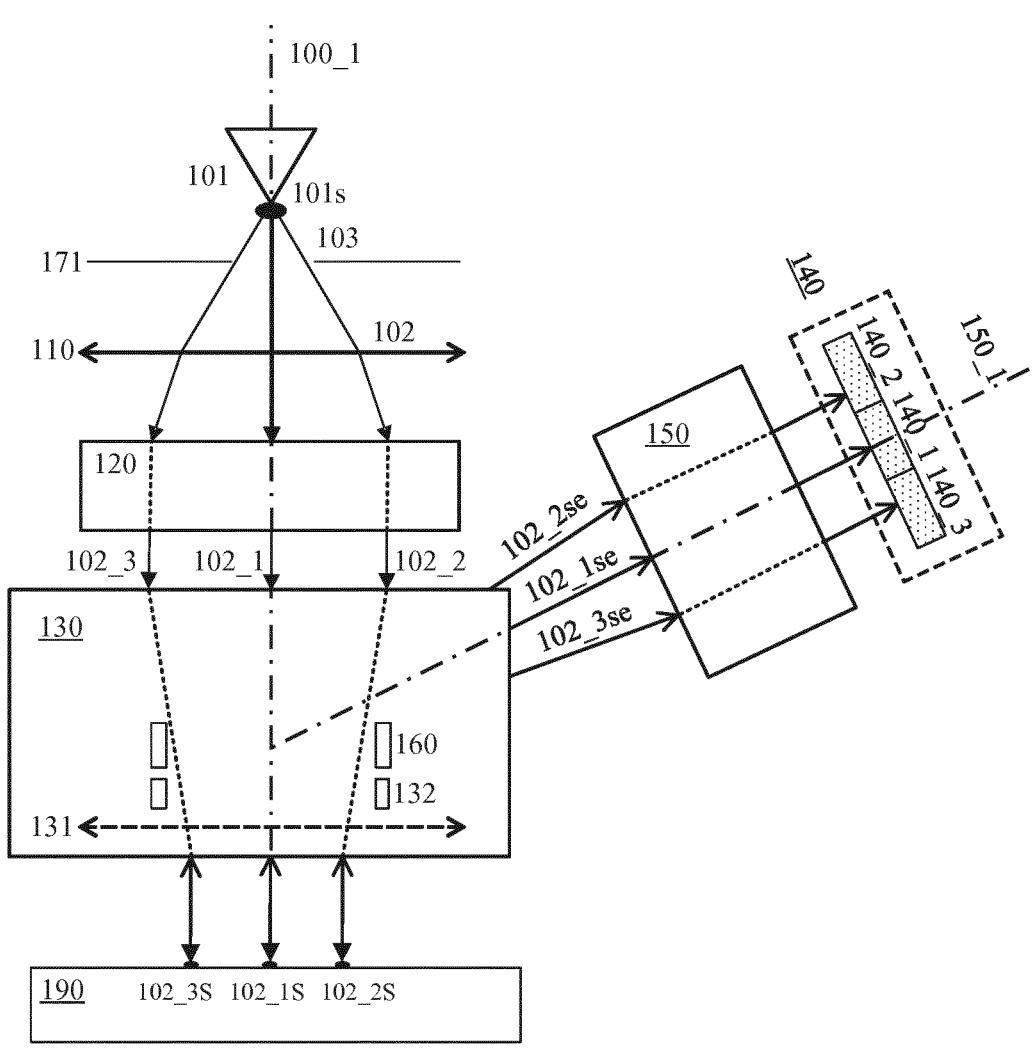
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool that can be a part of the exemplary charged particle beam inspection system of FIG. 1, consistent with embodiments of the present disclosure. An electron beam tool 100 (also referred to herein as apparatus 100) comprises an electron source 101, a gun aperture plate 171 with a gun aperture 103, a condenser lens 110, a source conversion unit 120, a primary projection optical system 130, a sample stage (not shown in FIG. 2), a secondary optical system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 100 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary optical system 150 and electron detection device 140 can be aligned with a secondary optical axis 150_1 of apparatus 100.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 can comprise an image-forming element array (not shown in FIG. 2). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 as an example, and it is appreciated that the source conversion unit 120 can handle any number of beamlets.

Condenser lens 110 can focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. Objective lens 131 can focus beamlets 102_1, 102_2, and 102_3 onto a sample 190 for inspection and can form three probe spots 102_1s, 102_2s, and 102_3s on surface of sample 190. Gun aperture plate 171 can block off peripheral electrons of primary electron beam 102 not in use to reduce Coulomb interaction effects. Coulomb interaction effects can enlarge the size of each of probe spots 102_1s, 102_2s, and 102_3s, and therefore deteriorate inspection resolution.

Beam separator 160 can be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 190. In response to incidence of beamlets 102_1, 102_2, and 102_3 at probe spots 102_1s, 102_2s, and 102_3s, three secondary electron beams 102_1se, 102_2se, and 102_3se can be emitted from sample 190. Each of secondary electron beams 102_1se, 102_2se, and 102_3se can comprise electrons with a distribution of energies including secondary electrons (energies≤50 eV) and backscattered electrons (energies between 50 eV and landing energies of beamlets 102_1, 102_2, and 102_3). Beam separator 160 can direct secondary electron beams 102_1se, 102_2se, and 102_3se towards secondary optical system 150. Secondary optical system 150 can focus secondary electron beams 102_1se, 102_2se, and 102_3se onto detection elements 140_1, 140_2, and 140_3 of electron detection device 140. Detection elements 140_1, 140_2, and 140_3 can detect corresponding secondary electron beams 102_1se, 102_2se, and 102_3se and generate corresponding signals used to construct images of the corresponding scanned areas of sample 190.

Figure 3:
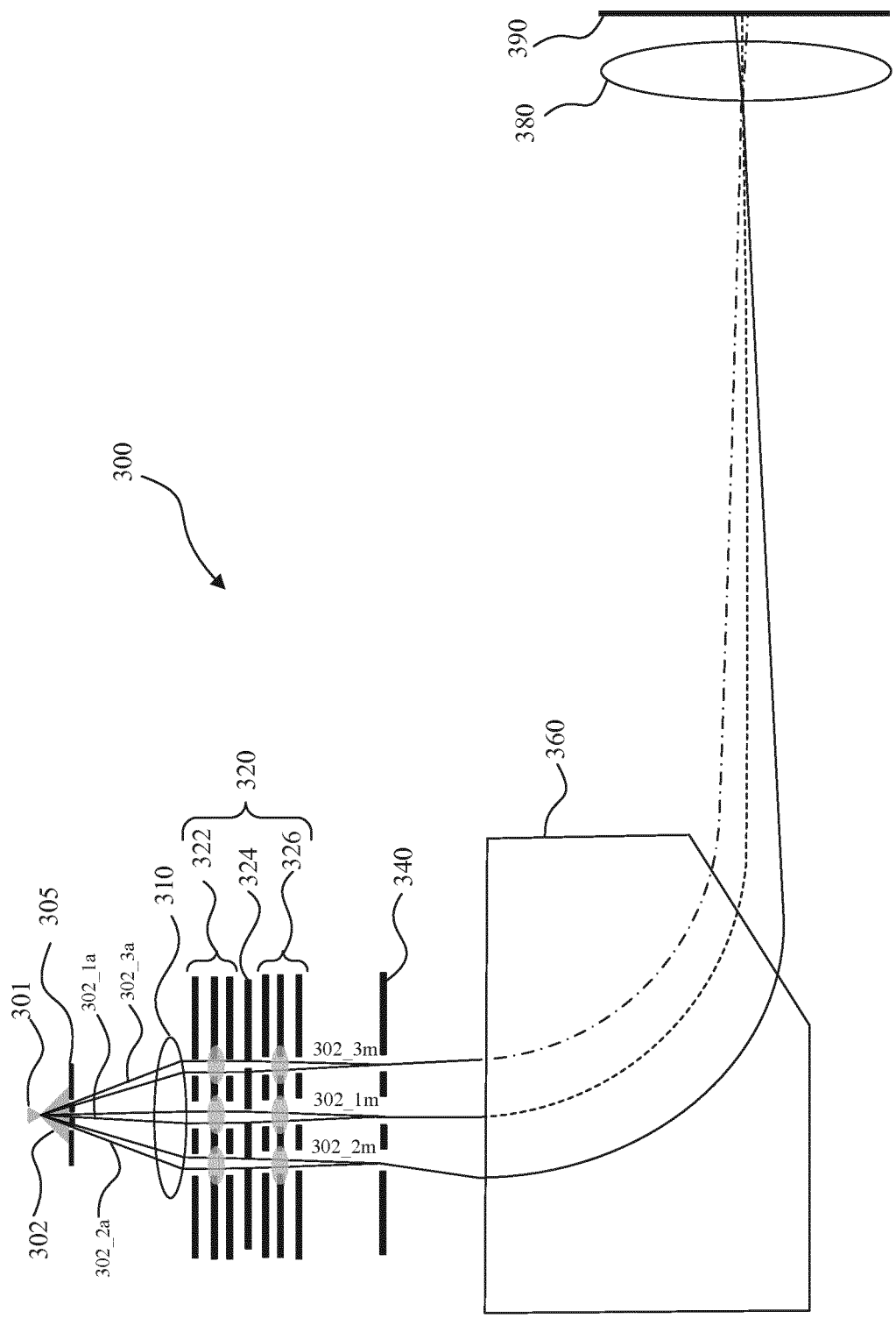
FIG. 3 is a schematic diagram illustrating an exemplary primary beam path in a multi-beam inspection system, consistent with embodiments of the present disclosure.

Reference is now made to FIG. 3, which illustrates a primary electron beam path in a multi-beam apparatus 300, consistent with embodiments of the present disclosure. As used herein, a primary beam path may be the path traversed by a primary electron beam or a beamlet from an electron source to the sample being inspected, or imaged, or studied. In some embodiments, as shown in FIG. 3, multi-beam apparatus 300 may comprise a primary electron source 301, primary electron beam 302, a beam-limiting aperture array 305, a condenser lens 310, a beam-limiting unit 320, a deflector array 340, a sector magnet unit 360, an objective lens assembly 380, and a sample 390.

Primary electron source 301 and primary electron beam 302 of multi-beam apparatus 300 are substantially similar to electron source 101 and primary electron beam 102 of electron beam tool 100 illustrated in FIG. 2. In some embodiments, primary electron source 301 may include, for example, tungsten filaments, Lanthanum hexaboride (LaB$_6$) cathodes, Cerium hexaboride (CeB$_6$), tungsten/Zirconium Oxide (W/ZrO$_2$), etc. An electron source may generate electrons through thermionic emission from a heated source, or through an electric-field induced emission from the cathodes. Other suitable methods of electron emission or electron generation may be employed as well.

Primary electron beam 302 may comprise electrons having high kinetic energies due to the high acceleration electric field to drive the electrons towards the sample. The kinetic energy of the electrons may be in the range of 0.2-40 keV or higher. In some embodiments, primary electron beam 302 may have an optical axis (not illustrated) along which primary electron beam 302 travels towards sector magnet unit 360.

In some embodiments, primary electron beam 302 may have an associated primary beam current. The associated primary beam current may be directly proportional to, but is not limited to, the number of electrons in a beam, energy of the electrons, extraction voltage applied to primary electron source 301, etc. The associated primary beam current may be in the range of 5 microamps (uA) to 100 uA. In some embodiments, a preferred range for the associated primary beam current may be 10 uA to uA. Other ranges and values of associated primary beam current may be used as appropriate.

In some embodiments, multi-beam apparatus 300 may comprise pre-current limiting aperture array 305 having a plurality of apertures to form a plurality of beamlets. FIG. 3 shows three beamlets 302_1a, 302_2a, and 302_3a as an example, but it is appreciated that pre-current limiting aperture array 305 may form any number of beamlets, as appropriate. The cross-section of the apertures of pre-current limiting aperture array 305 may be, for example, circular, rectangular, elliptical, or combinations thereof.

In some embodiments, pre-current limiting aperture array 305 may comprise a substantially planar structure, placed at a pre-determined distance from primary electron source 301, such that the plane of pre-current limiting aperture array 305 is perpendicular to the optical axis of primary electron beam 302. The distance A1, referred to as the vertical distance between primary electron source 301 and pre-current limiting aperture array 305 may be in the range of 5 mm to 10 mm. The position of pre-current limiting aperture array 305 along the optical axis may be fixed or adjustable, as appropriate. In a preferred embodiment of this disclosure, the distance A1 may be approximately 6 mm.

In some embodiments, pre-current limiting aperture array 305 may comprise a matrix of uniform apertures, for example, each of the apertures of pre-current limiting aperture array 305 may be uniform in cross-section, shape or size. In some embodiments, pre-current limiting aperture array 305 may comprise a matrix of non-uniform apertures, including apertures of non-uniform cross-section, shape or size. In some embodiments, the apertures may be arranged in a linear, circular, rectangular, spiral, zig-zag, serpentine, triangular pattern, or combinations thereof. It is appreciated that apertures of pre-current limiting aperture array 305 may be laid out randomly across the array. Other suitable layouts and configurations of the apertures may be used as well.

In some embodiments, pre-current limiting aperture array 305 may comprise a metal, a ceramic, a plastic, an alloy, a composite, a semiconductor, or any suitable material that is vacuum-compatible and can be processed to form apertures. The apertures of pre-current limiting aperture array 305 may be fabricated using photolithography, embossing, ultraprecision laser machining, injection molding, mechanical drilling, etc. or any suitable technique.

In some embodiments, pre-current limiting aperture array 305 may be configured to reduce the primary beam current by splitting primary electron beam 302 into a plurality of primary beamlets 302_1a, 302_2a, and 302_3a. Each of the primary beamlets 302_1a, 302_2a, and 302_3a may have an associated primary beamlet current lower than the primary beam current of primary electron beam 302.

In some embodiments, the current associated with primary beamlet such as 302_1a, may be based on the size of the aperture of pre-current limiting aperture array 305 configured to generate primary beamlet 302_1a. In an apparatus comprising a pre-current limiting aperture array 305 including uniform apertures, each of the beamlets generated may have substantially similar associated beamlet current values. In some embodiments, each of primary beamlets 302_1a, 302_2a, and 302_3a may have an associated primary beamlet current in the range of 5 nanoamps (nA) to 50 nA. In a preferred embodiment, the associated primary beamlet current may be in the range of 5 nA-40 nA.

Referring back to FIG. 3, multi-beam apparatus 300 may comprise condenser lens 310. Condenser lens 310 of multi-beam apparatus 300 is substantially similar to condenser lens 110 of electron beam tool 100 illustrated in FIG. 2. Condenser lens 310 may be configured to collimate primary beamlets 302_1a, 302_2a, and 302_3a. Electron beams are inherently divergent, and uncollimated electron beams may generate undesirably larger probe spots, resulting in poor resolution of the acquired images. For example, in a SEM, primary electron beam 302 may be divergent after passing through the anode plate and may have to be collimated by condenser lens 310 into multiple relatively parallel beamlets.

In some embodiments, multi-beam apparatus 300 may comprise beam-limiting unit 320 configured to modify the associated primary beamlet current of each of primary beamlets 302_1a, 302_2a, and 302_3a. Beam-limiting unit 320 may include a first micro-lens array 322, a second micro-lens array 326, and a current limiting aperture array 324. The micro-lens arrays, for example, first micro-lens array 322 and second micro-lens array 326, may be fabricated using micro-electromechanical systems (MEMS) based methods employing a combination of semiconductor fabrication processes such as photolithography, wet/dry etching, thin film deposition, passivation, etc. Other methods of fabricating lens arrays may include, but are not limited to, femtosecond laser wet etching, ultraprecision micro-machining techniques including single point diamond turning, diamond micro-milling, etc.

As illustrated in FIG. 3, first micro-lens array 322 may comprise a plurality of electrostatic lenses or electromagnetic lenses, or combinations thereof. In some embodiments, first micro-lens array 322 may comprise a three-electrode lens array. Each of the three electrode lenses may include a plurality of apertures, also referred to herein as lens holes. Each of the three electrode lenses may be aligned such that the apertures or lens holes in each electrode lens are aligned to allow each of primary beamlets 302_1a, 302_2a, and 302_3a to pass through. Further, the three electrodes may be aligned in such a manner that the center of primary electron beam 302 passes through the geometric center of each electrode lens. In some embodiments, first micro-lens array 322 may comprise a single planar electrode with one or more macro-electrodes configured to form converging and substantially parallel beamlets.

In some embodiments, the apertures of an electrode lens of first micro-lens array 322 may be uniform in shape, size, or cross-section. Further, each of the electrode lenses of first micro-lens array 322 may comprise apertures having uniform shape, size or cross-section. In some embodiments, the apertures within an electrode lens may be non-uniform in shape, size or cross-section.

In some embodiments, the apertures or lens holes in each electrode lens may have a circular or an elliptical cross-section. It is appreciated that the apertures may preferably have an elliptical cross-section for correction of astigmatism, and the size of the apertures, for example, indicated by a diameter, is made larger for off-axial lenses for field curvature correction. The field curvature may also be corrected by increasing lens radius of off-axial lenses in first micro-lens array 322.

In the context of this disclosure, field curvature, commonly referred to as Petzval field curvature in microscopy, is an imaging artifact that refers to the optical aberration in which a flat object normal to the optical axis cannot be brought properly into focus on a flat image plane. When visible light is focused through a curved lens, the image plane produced by the lens is a curved Petzval surface. The image can be focused over a large number of focal planes to produce either a sharp focus on the edges or in the center of the image. When the specimen is viewed in a microscope, it either appears sharp and crisp in the center or on the edges of the view field, but not both. This artifact is commonly referred to as field curvature or curvature of field. One of the solutions to minimize field curvature is to use lenses with larger focal lengths or increasing radius of off-axial lenses in a lens array.

In some embodiments, beam-limiting unit 320 may comprise second micro-lens array 326 positioned downstream of first micro-lens array 322, as illustrated in FIG. 3. Second micro-lens array 326 may comprise a three-electrode lens array, or a single planar electrode with one or more macro-electrodes, or two-electrode lens array. In a three-electrode lens array configuration similar to first micro-lens array 322, each of the three electrode lenses may include a plurality of apertures. In some embodiments, second micro-lens array 326 may be similar to first micro-lens array in structure, for example, the apertures of second micro-lens array 326 may be substantially similar to first micro-lens array 322 in shape, size or cross-section. Each of the electrode lenses of second micro-lens array 326 may be aligned with each other as well as with the electrode lenses of first micro-lens array 322 such that the center of primary electron beam 302 passes through the geometric center of each electrode lens of both the first and second micro-lens arrays.

Beam limiting unit 320 may comprise current-limiting aperture array 324 including a plurality of apertures. Current-limiting aperture array 324 may be positioned between first micro-lens array 322 and second micro-lens array 326. In some embodiments, current-limiting aperture array 324 may be positioned downstream of second micro-lens array 326, such that it is disposed between second micro-lens array 326 and deflector array 340 (described later). In some embodiments, first micro-lens array 322, current limiting aperture array 324, and second micro-lens array 326 may be disposed in a manner that they are aligned with each other and the primary optical axis.

The apertures of current-limiting aperture array 324 may be smaller than the apertures of first micro-lens array 322, or second micro-lens array 326. In some embodiments, the apertures of pre-current limiting aperture array 305 may be smaller than the apertures of current-limiting aperture array 324. The current associated with each of primary beamlets 302_1a, 302_2a, and 302_3a may be adjusted while passing through beam-limiting unit 320 at least based on a selection of the aperture sizes of first micro-lens array 322 and current-limiting aperture array 324, forming primary modified beamlets 302_1m, 302_2m, and 302_3m downstream of beam-limiting unit 320. In some embodiments, each of primary modified beamlets 302_1m, 302_2m, and 302_3m may have modified beamlet current or beamlet size based on the apertures. For example, each of primary modified beamlets 302_1m, 302_2m, and 302_3m may have an associated modified beamlet current in the range of 10 picoamps (pA)-100 pA.

In some embodiments, a current reduction factor, as referred to herein, is the difference in current associated with each of the primary beamlets upstream of beam-limiting unit 320 (e.g., primary beamlets 302_1a, 302_2a, and 302_3a) and corresponding beamlets downstream of beam-limiting unit 320 (e.g., beamlets 302_1m, 302_2m, and 302_3m). In some embodiments, where each of the beamlets are substantially uniform in size, shape and cross-section, the current reduction factor may be based on a ratio of average primary beamlet current to average modified beamlet current. The current reduction ratio may be in the range of 2 to 1000, or any suitable range. In a preferred embodiment, the ratio is in the range of 2 to 200. In some embodiments, the current reduction factor may be determined for individual beamlets as well.

In some embodiments, beam-limiting unit 320 may be configured such that each of primary modified beamlets cross-over in a cross-over plane. The position of the cross-over plane may be based on, among other factors, focal strength of first micro-lens array 322 or focal strength of second micro-lens array 326. The cross-over plane may be formed substantially perpendicular to the primary optical axis. The vertical length of beam-limiting unit 320 along primary optical axis may preferably be in the range of 10 mm-20 mm.

In some embodiments, multi-beam apparatus 300 may comprise deflector array 340 including a plurality of beam-deflectors. Deflector array 340 is substantially similar to deflection scanning unit 132 of FIG. 2. Deflector array 340 may be disposed in the cross-over plane formed by beam-limiting unit 320. In some embodiments, deflector array 340 may be configured to direct each of primary modified beamlets 302_1m, 302_2m, and 302_3m into sector magnet unit 360.

Sector magnet unit 360 may comprise an electron-beam bending magnet system using a plurality of sector magnets. The emergent electron beam from an electron source (e.g., primary electron source 301 of FIG. 3) may be deflected magnetically to be directed to a sample target. In a two-magnet system, one magnet may deflect the electron beam by an angle greater than 180° and the other magnet may deflect the beam by less than 90°. If a finite energy spread beam is injected into a magnet with more than 180° deflection, the output beam will be convergent. If the same beam is injected vertically upwards into a less than 90° deflection magnet, the output beam would be a divergent beam. The amount of convergence and divergence of beam may depend upon the bending angle of each magnet and the pole face angle at the exit edge of first magnet and entrance of the second magnet. It should be appreciated that other configurations of sector magnets for beam bending and convergence may be employed as well.

In some embodiments, sector magnet unit 360 may comprise a plurality of magnets. The plurality of magnets may include magnetic plates, magnetic sectors, magnetic columns, magnetic discs, or combinations thereof. Other forms and shapes of magnets may be used as well. In some embodiments, sector magnet unit 360 may comprise two magnetic plates with a uniform magnetic field between them.

As shown in FIG. 3, sector magnet unit 360 may be configured to direct each of incoming primary modified beamlets 302_1m, 302_2m, and 302_3m towards objective lens 380 or wafer 390. In some embodiments, sector magnet unit 360 may be configured to bend the beamlets by any suitable angle such that primary modified beamlets 302_1m, 302_2m, and 302_3m are directed towards objective lens assembly 380 or wafer 390 and converge at a cross-over plane within or at least near objective lens assembly 380. As used herein, "within" an objective lens assembly 380 refers to the existence of the cross-over plane within the space encompassed by objective lens having a cylindrical cross-section and a hollow core. It should be appreciated that the dimensions of the objective lens may vary based on the design and the purpose. As used herein, "near" the objective lens assembly refers to the physical proximity of the cross-over plane to the objective lens. The cross-over plane may be formed outside but immediately adjacent to objective lens assembly 380, such that the distance between the cross-over plane and objective lens assembly 380 may be 5 mm or less. It is to be appreciated that the cross-over plane may be formed an appropriate distance away from objective lens assembly 380.

In some embodiments, sector magnet unit 360 may also be configured to separate secondary beamlets (for e.g., secondary beamlets 402_1b, 402_2b, and 402_3b of FIG. 4, discussed later) from primary modified beamlets 302_1m, 302_2m, and 302_3m.

In some embodiments, objective lens assembly 380 is substantially similar to primary optical system 130 comprising objective lens 131 of FIG. 2. To obtain a higher resolution of images formed by a charged-particle beam (such as, primary electron beam 102 of FIG. 2) objective lens 131 may be an electromagnetic compound lens in which the sample may be immersed in the magnetic field of objective lens 131. In some embodiments, objective lens 131 may include a magnetic lens and an electrostatic lens (not illustrated). The magnetic lens may be configured to focus the charged-particle beam, or each primary beamlet in a multi-beam apparatus (such as, electron beam tool 100 of FIG. 2), at relatively low aberrations to generate relatively small probe spots on a sample. The electrostatic lens may be configured to influence the landing energy of the charged-particle beam or each primary beamlet to ensure that the primary charged-particles land on the sample at a relatively low kinetic energy and pass through the apparatus with a relatively high kinetic energy. In some embodiments, objective lens 131 may be configured to be an "immersion lens." As a result, the sample may be immersed both in an electrostatic field E (electrostatic immersion) of the electrostatic lens and a magnetic field B (magnetic immersion) of the magnetic lens. Electrostatic immersion and magnetic immersion may reduce aberrations of objective lens 131. As electrostatic and magnetic fields get stronger, the aberrations of objective lens 131 may become smaller. Electrostatic field E, however, should be limited to within a safe range in order to avoid discharging or arcing on the sample. Due to this limitation of the field strength of electrostatic field E, further enhancement of the magnetic field strength in an immersion configuration may allow a further reduction in the aberrations of objective lens 131, and thereby improve image resolution.

Referring back to FIG. 3, in some embodiments, primary modified beamlets 302_1m, 302_2m, and 302_3m may arrive on sample surface, such as wafer 390, in an at least a substantially perpendicular direction. Magnetic immersion, however, may influence the landing angles of all primary modified beamlets landing on wafer 390. In particular, magnetic field B may cause each electron in a modified beamlet to obtain an angular velocity $\theta^{(1)}$, as shown in equation (1) below:

$$r^2\theta^{(1)} = \frac{1}{2}\frac{e}{m}r^2B + C \quad \text{(Equation 1)}$$

wherein C is a constant related to an initial angular velocity of the electron, r is a position shift from optical axis of objective lens 131, and e and m are the charge and the mass of the electron, respectively. For the electron to land on wafer 390 in a perpendicular manner, angular velocity $\theta^{(1)}$ must be zero on wafer 390.

In some embodiments, magnetic lens may be configured to operate in a non-magnetic immersion mode, and magnetic field B is zero (or substantially zero) or below the preset ratio value on wafer 390. If an electron enters magnetic field B along a meridional path, its corresponding constant C is zero and its angular velocity $\theta^{(1)}$ will be zero or substantially zero on wafer 390. Objective lens 131 may have a real front focal point on its front focal plane. When the chief rays (or center rays) of off-axis primary beamlets 302_2m and 302_3m enter objective lens 131 along some specific meridional paths, the chief rays can pass through the real front focal point and off-axis primary beamlets 302_2m and 302_3m can land perpendicular on wafer 390. Accordingly, primary modified beamlets 302_1m, 302_2m, and 302_3m overlap together on the front focal plane and form a relatively sharp beamlet crossover centering at the real front focal point.

In other embodiments, magnetic lens may be configured to operate in magnetic immersion mode in which magnetic field B is not zero on wafer 390. Therefore, angular velocity $\theta^{(1)}$ of an electron may be zero (or substantially zero) on wafer 390 if its corresponding constant C is not zero when the electron enters magnetic field B and complies with the condition in equation (2):

$$C = -\frac{1}{2}\frac{e}{m}r^2B \quad \text{(Equation 2)}$$

When C is not equal to zero, the electron enters magnetic field B along a skew path and cannot cross primary optical axis before entering magnetic field B. Hence, an electron can perpendicularly land on wafer 390 only if entering magnetic field B along a specific skew path, and the electron cannot really cross primary optical axis during passing through magnetic field B. Accordingly, objective lens 131 may have a virtual front focal point. When the chief rays (or center rays) of off-axis primary modified beamlets 302_2m and 302_3m enter objective lens 131 along some specific skew paths, they can virtually pass through virtual front focal point and land perpendicular on wafer 390. Under this scenario, off-axis primary beamlets 302_2m and 302_3m are closest to each other on principal plane of objective lens 131, and each off-axis primary beamlets 302_2m and 302_3m has a radial shift from primary optical axis. The primary modified beamlets 302_1m, 302_2m, and 302_3m, therefore only partially overlap with each other on principal plane and form a partial overlap beamlet crossover on principal plane. Moreover, radial shift increases as magnetic field B on wafer 390 increases. Current density is lower in the partial overlap beamlet crossover than in the foregoing sharp beamlet crossover. Therefore, the Coulomb interaction effects between primary beamlets 302_1m, 302_2m, and 302_3m in magnetic immersion mode is relatively low, thereby further contributing to the small sizes of probe spots.

Figure 4:
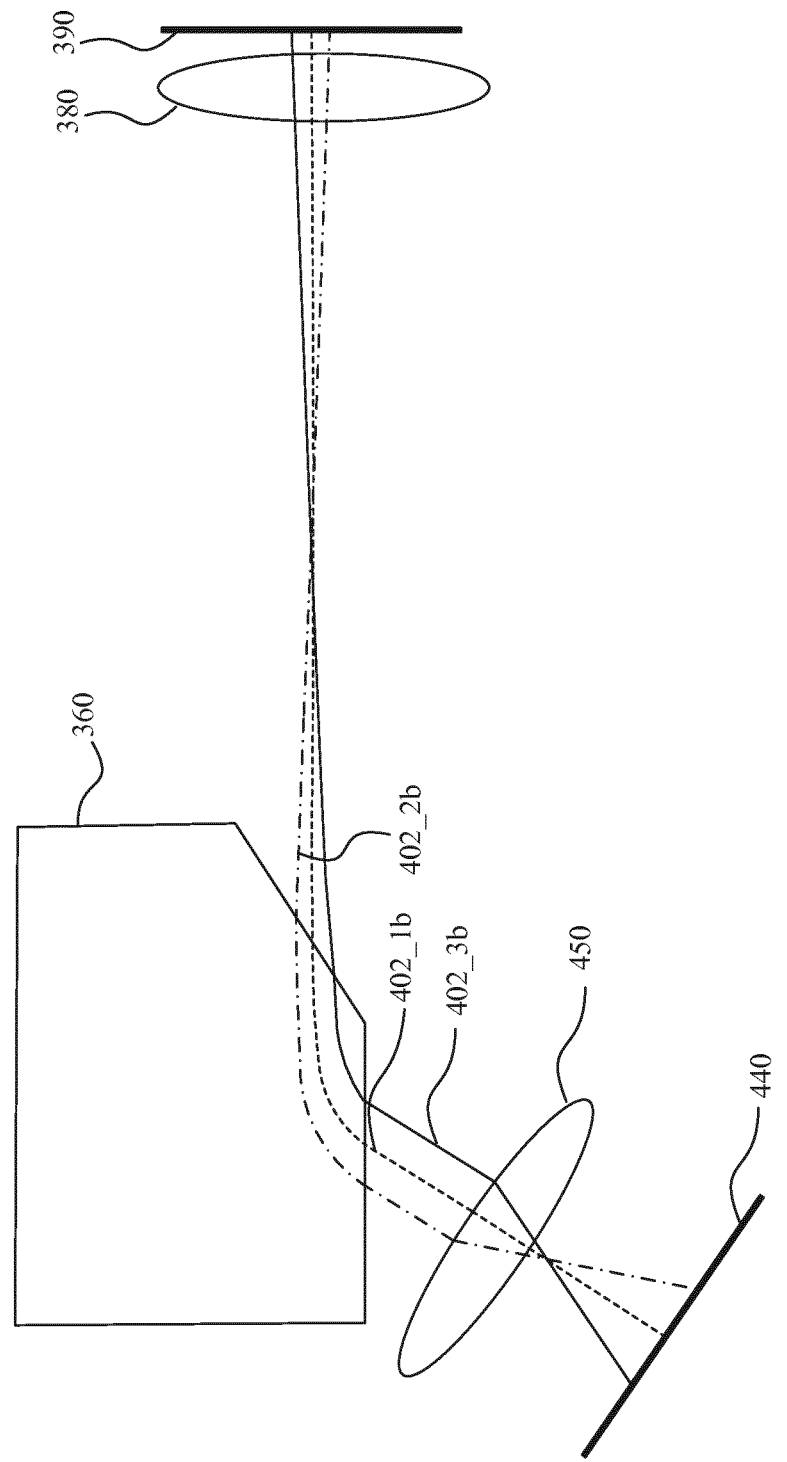
FIG. 4 is a schematic diagram illustrating an exemplary secondary beam path in a multi-beam inspection system, consistent with embodiments of the present disclosure.

Reference is now made to FIG. 4, which illustrates a secondary beam path in multi-beam apparatus 300, consistent with embodiments of the present disclosure. As used herein, a secondary beam path may be the path traversed by secondary electrons generated from the probe spots on the sample to the electron detection device, such as an electron detector. In response to incidence of primary modified beamlets 302_1m, 302_2m, and 302_3m at probe spots (not shown), electrons emerge from wafer 390 and generate three secondary electron beamlets, referred to herein as secondary beamlets 402_1b, 402_2b, and 402_3b, which, in operation, are emitted from wafer 390. Each of secondary beamlets 302_1b, 302_2b, and 302_3b typically comprise electrons having different energies including secondary electrons (having electron energy≤50 eV) and backscattered electrons (having electron energy between 50 eV and the landing energy of primary modified beamlets 302_1m, 302_2m, and 302_3m).

As shown in FIG. 4, sector magnet unit 360 may be configured to deflect secondary beamlets 402_1b, 402_2b, and 402_3b towards projection lens assembly 450 (which can be similar to secondary optical system 150 of FIG. 2). Projection lens assembly 450 may focus secondary beamlets 402_1b, 402_2b, and 402_3b onto detection elements of electron detection device 440 (which can be similar to electron detection device 140 of FIG. 2). Detection device 440 may comprise detection elements configured to detect secondary beamlets 402_1b, 402_2b, and 402_3b and generate corresponding signals that may be sent to signal processing units (not shown), for example, to construct images of the corresponding scanned areas of wafer 390.

In some embodiments, sector magnet unit 360 may be configured to separate secondary beamlets (e.g., 402_1b, 402_2b, and 402_3b) from primary modified beamlets (e.g., 302_1m, 302_2m, and 302_3m), while scanning. In some embodiments, secondary beamlets 402_1b, 402_2b, and 402_3b may form a cross-over in a plane before entering sector magnet unit 360. Thus, sector magnet unit 360 is disposed downstream of the cross-over of the secondary beamlets 402_1b, 402_2b, and 402_3b. The sector magnet unit 360 may be configured to function as a field lens by adjusting the magnetic force applied on primary modified beamlets (e.g., 302_1m, 302_2m, and 302_3m), and as a Wien filter to selectively deflect the electrons in a beamlet towards electron detection device 440.

As used herein, a field lens may be referred to a magnetic, an electric, or an electromagnetic lens configured to adjust the landing energy of the electrons in the electron beam by applying magnetic and electric fields simultaneously to the incident electrons. For example, an electric retarding field lens, which slows the primary electron beam from an energy of around 10 keV to 1 keV within a distance of few millimeters may be used. A magnetic field may be superimposed onto the electric retarding field so that the primary electron beam can be focused.

Figure 5:
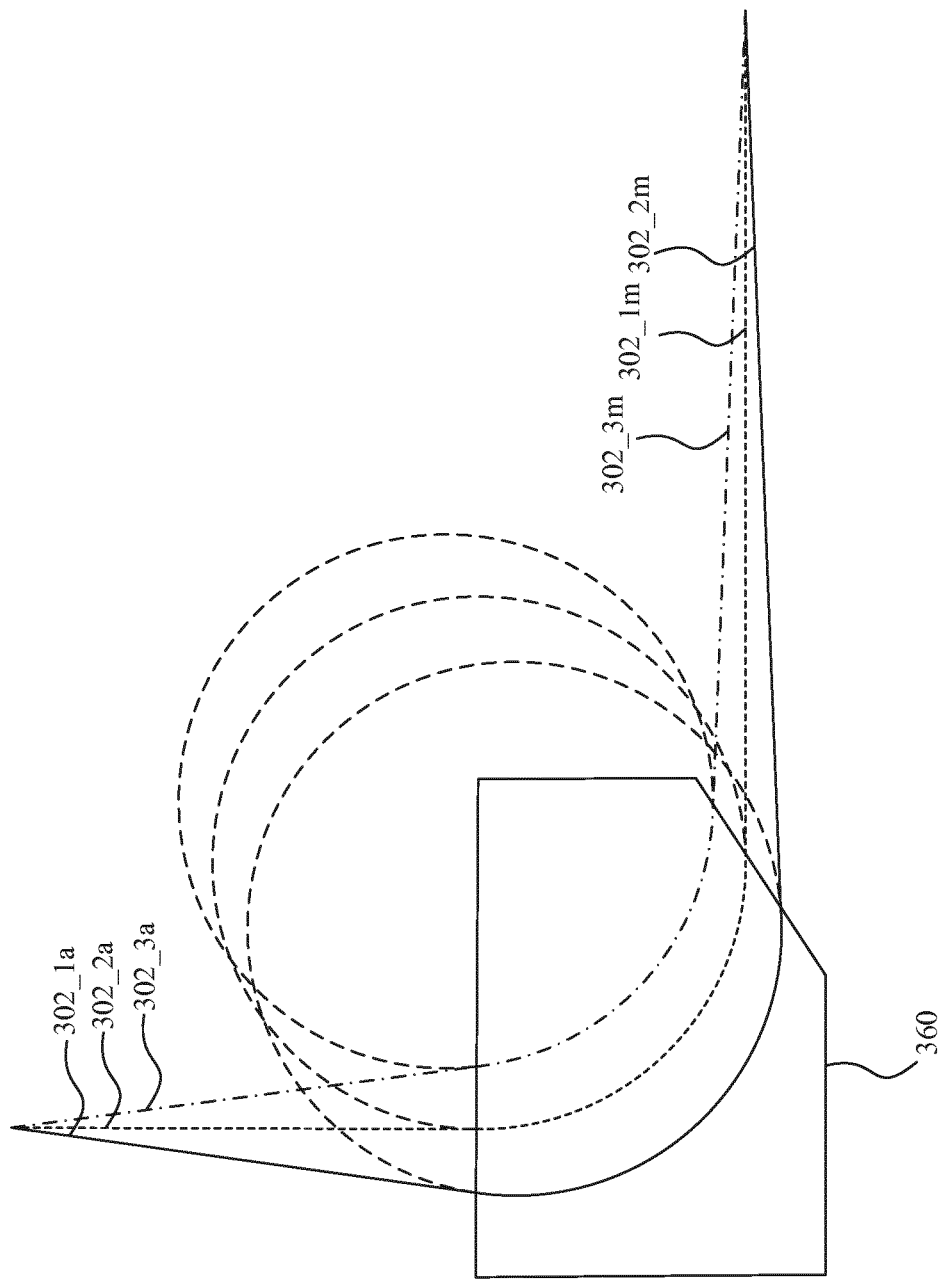
FIG. 5 is a schematic diagram illustrating an exemplary primary beam path through a sector magnet unit in a multi-beam inspection system, consistent with embodiments of the present disclosure.

FIG. 5 illustrates an exemplary primary path for a charged-particle beam (e.g., electrons) through sector magnet unit 360 in multi-beam apparatus 300, consistent with embodiments of the present disclosure. Sector magnet unit 360 may comprise two or more magnetic plates with uniform magnetic field between the plates configured to bend one or more primary modified beamlets (e.g., 302_1m, 302_2m, and 302_3m). In some embodiments, as shown in FIG. 5, primary modified beamlets 302_1m, 302_2m, and 302_3m, entering sector magnet unit 360 may follow a circuitous path before exiting.

The circular loops shown in FIG. 5 represent an imaginary path of the electrons in the absence of well-shaped sector magnets of sector magnetic unit 360. With appropriately designed shapes of sector magnets, beamlets 302_1m, 302_2m, and 302_3m may exit the sector magnet unit 360 at a pre-determined angle with respect to the angle formed by the incoming beamlets.

In some embodiments, electrons in primary modified beamlets 302_1m, 302_2m, and 302_3m exiting sector magnet unit 360 may have different kinetic energies compared to primary beamlets 302_1a, 302_2a, and 302_3a. In some embodiments, sector magnet unit 360 may be configured to modify characteristics of primary beamlets 302_1a, 302_2a, and 302_3a, including, but not limited to, direction, beam energy, beam spread, cross-over focal plane distance of beamlets. It should be appreciated that some components of multi-beam apparatus 300, for example, pre-current limiting aperture array 305, condenser lens 310, beam limiting unit 320, and deflector array 340 are omitted from FIG. 5 for illustrative reasons only.

Figure 6:
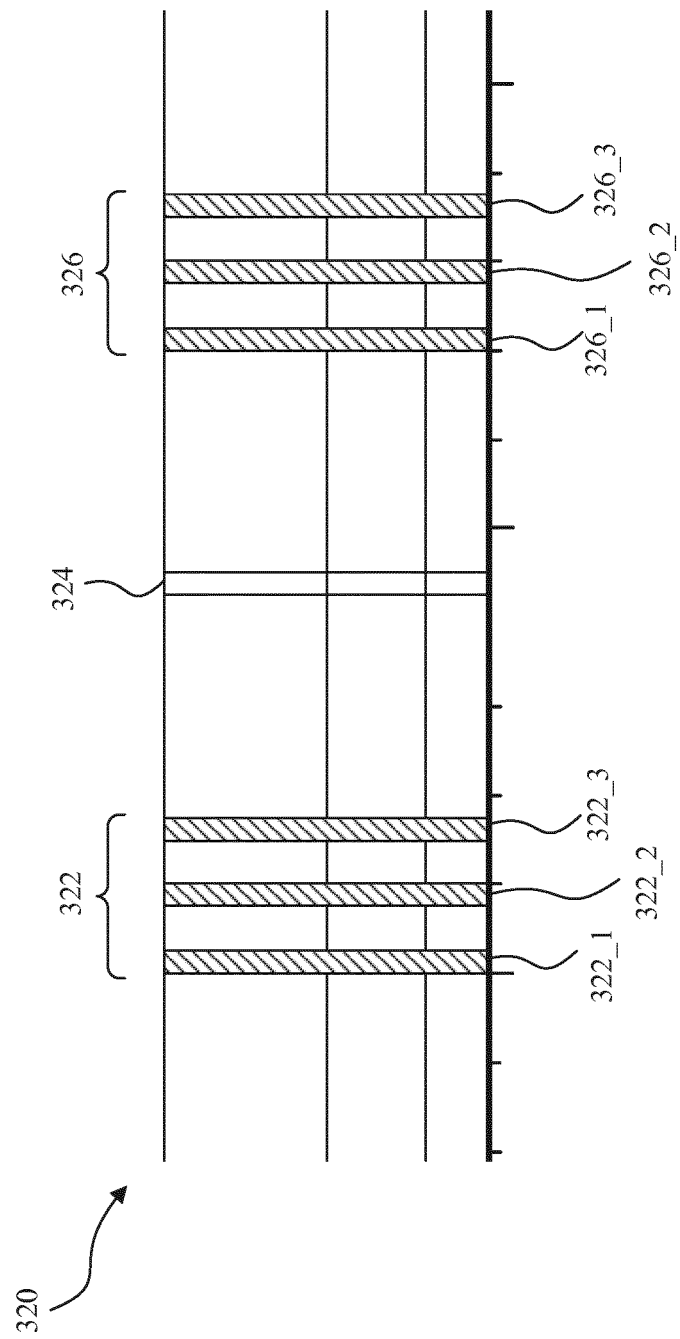
FIG. 6 is a schematic diagram illustrating an exemplary beam-limiting unit in a multi-beam inspection system, consistent with embodiments of the present disclosure.

Reference is now made to FIG. 6, which illustrates an exemplary beam-limiting unit 320 in a multi-beam inspection system, consistent with embodiments of the present disclosure. Beam-limiting unit 320, as illustrated, may comprise MEMS optics including first micro-lens array 322 and second micro-lens array 326, and current limiting aperture array 324 disposed between the two micro-lens arrays. In some embodiments, first micro-lens array 322 may include three electrode lenses 322_1, 322_2, and 322_3, spaced equidistantly apart. The distance between immediately adjacent electrode lenses, for example, between 322_1 and 322_2, or between 322_2 and 322_3 may be 3 mm or lower, 2.5 mm or lower, 2 mm or lower, 1.5 mm or lower, 1 mm or lower, 0.5 mm or lower, or 0.2 mm.

In some embodiments, second micro-lens array 326 may include three electrode lenses 326_1, 326_2, and 326_3, spaced equidistantly apart. The distance between immediately adjacent electrode lenses, for example, between 326_1 and 326_2, or between 326_2 and 326_3 may be 3 mm or lower, 2.5 mm or lower, 2 mm or lower, 1.5 mm or lower, 1 mm or lower, 0.5 mm or lower, or 0.2 mm. It should be appreciated that the distance between any two pairs of electrode lenses within a micro-lens array may be different as well.

In some embodiments, voltage applied to a micro-lens array (e.g., first micro-lens array 322) may not exceed a maximum allowable voltage determined by the maximum allowable electric field and the distance between the electrodes (e.g., electrodes 322_1 and 322_2). The maximum allowable electric field, as used herein, may be defined as the electric field above which arcing between the MEMS layers (e.g., electrodes 322_1 and 322_2) may occur.

In some embodiments, electric field in first micro-lens array 322 and second micro-lens array 326 may determine the distance of the cross-over plane formed by beam-limiting unit 320. As referred to herein, the distance of the cross-over plane may be defined as the vertical distance along primary optical axis between electrode 326_3 and deflector array (e.g., deflector array 340 of FIG. 3). In some embodiments, the distance of the cross-over plane may be inversely proportional to the electric field in first micro-lens array 322, for example, for an electric field of 5 kV/mm in first micro-lens array 322, the distance of the cross-over plane from beam-limiting unit 320 may be 45 mm, and for an electric field of 2 kV/mm, the distance of the cross-over plane may be 105 mm. In other words, the distance of the deflector array 340 disposed in the cross-over plane may be determined based on the electric field in first micro-lens array 322 or second micro-lens array 326. The distance of the cross-over plane from electrode 326_3 may be in the range of 20 mm to 250 mm, and preferably in the range of 50 mm to 200 mm.

Figure 7:
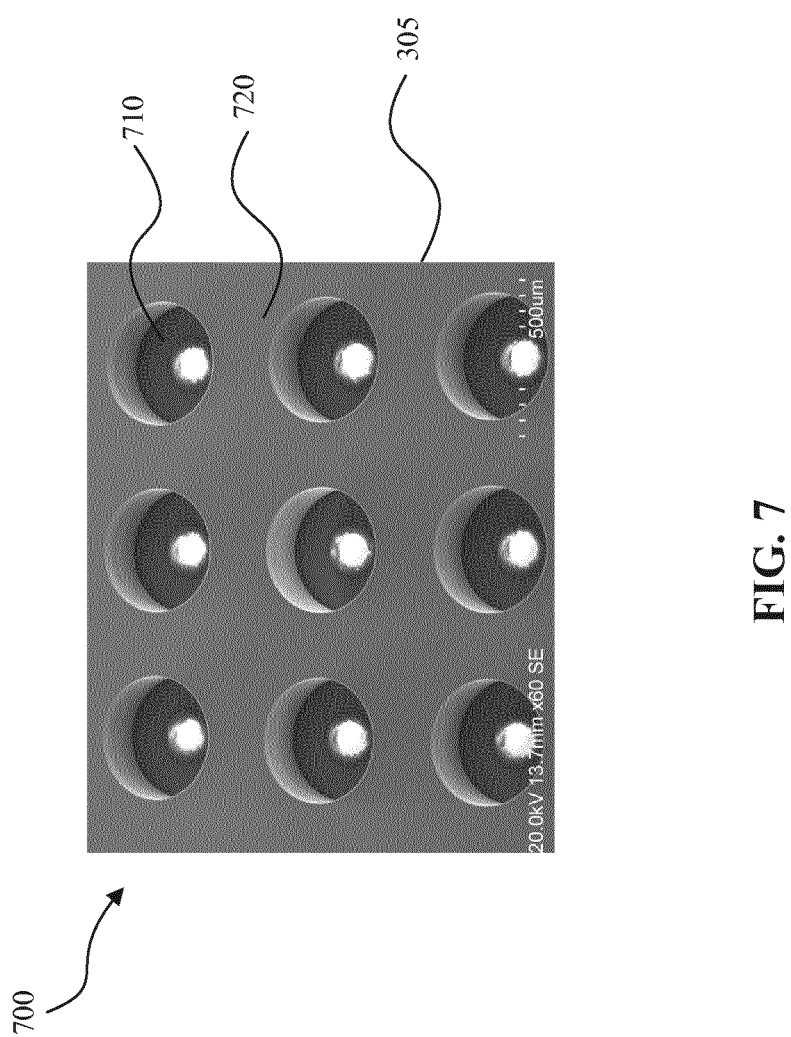
FIG. 7 is a scanning electron microscope image of an exemplary pre-current limiting aperture array of a multi-beam inspection system, consistent with embodiments of the present disclosure.

Reference is now made to FIG. 7, which illustrates a scanning electron microscope image 700 of a portion of pre-current limiting aperture array 305 of an exemplary multi-beam apparatus 300, consistent with embodiments of the present disclosure. As illustrated, pre-current limiting aperture array 305 may include an array of apertures 710 arranged in a rectangular matrix. In some embodiments, each aperture 710 may be substantially uniform in size, shape, and cross-section to generate primary beamlets of substantially similar beam size, beam energy, and beam spread, among other parameters. In some embodiments, aperture 710 may be smaller in size compared to apertures of current-limiting aperture array 324 to mitigate the Coulomb interaction effects, thereby maintaining or enhancing spatial resolution of multi-beam apparatus.

In some embodiments, pre-current limiting aperture array 305 may include apertures 710 of non-uniform shape, size, or cross-section to generate beamlets having a range of beam size, beam energy, or beam spread. Consequently, each primary beamlet (e.g., primary beamlets 302_1a, 302_2a, and 302_3a) may generate probe spots having non-uniform size.

In some embodiments, pre-current limiting aperture array 305 may include a plate 720 made from a material comprising metal, or ceramic, or a metal alloy, a semiconductor, reinforced plastic, vacuum compatible plastic, etc. The array of apertures 710 may be fabricated by a photolithography process in wafer fab, MEMS processes, or using an ultra-precision laser machining process, an additive manufacturing process such as 3D printing, or subtractive manufacturing, etc. Other suitable techniques may be employed as well.

Figures 8A, 8B:
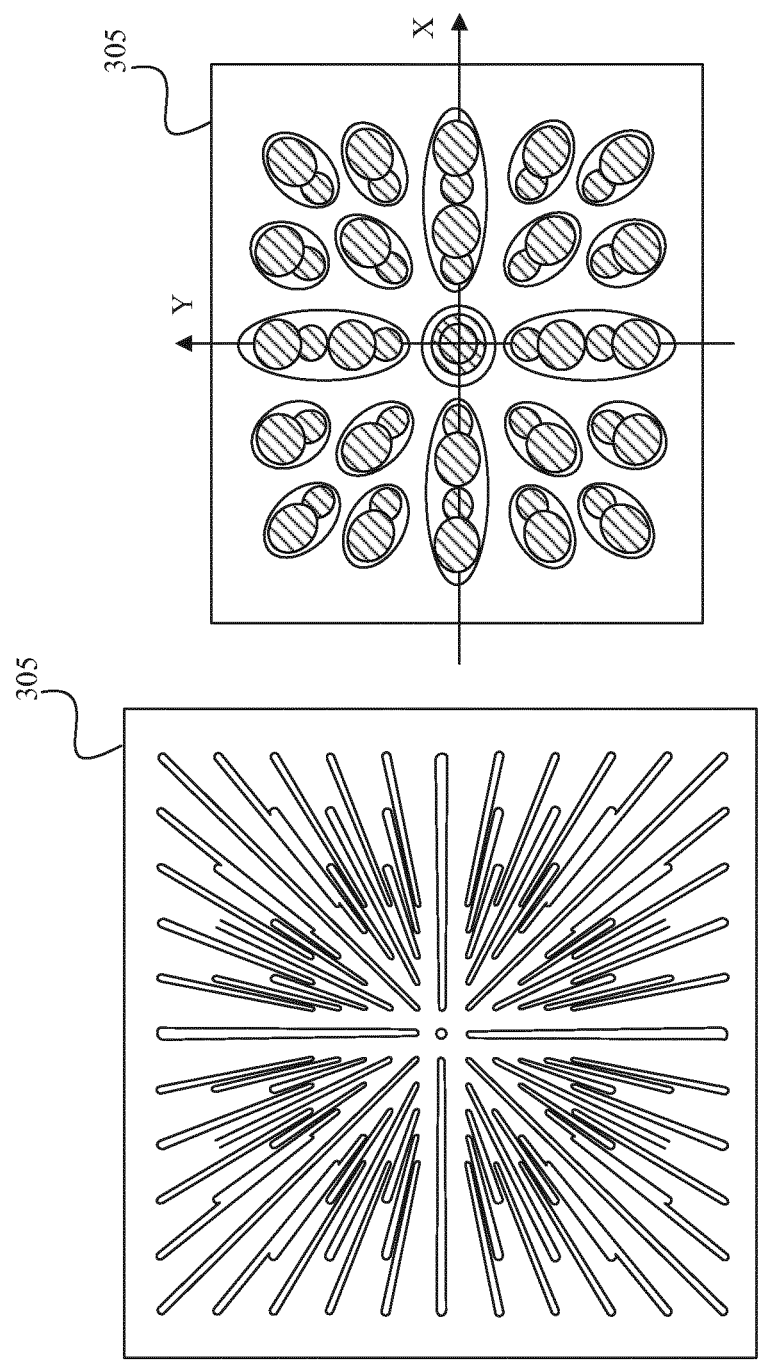
FIGS. 8A and 8B are schematic diagrams each illustrating an exemplary configuration of a pre-current limiting aperture array of a multi-beam inspection system, consistent with embodiments of the present disclosure.

Reference is now made to FIGS. 8A and 8B, which are cross sectional diagrams at X-Y plane of pre-current limiting aperture array (e.g., pre-current limiting aperture array 305 of FIG. 3), consistent with embodiments of the present disclosure. FIG. 8A shows an example with elongated apertures of various lengths that may be placed diagonally, horizontally, or vertically. To obtain higher throughput in multi-beam apparatus, more beamlets may be needed and a larger variation of probe currents may also be needed. If the distance between two apertures is small, some apertures may partially overlap forming a larger aperture, as shown in FIG. 8B. The partially overlapping beamlet-forming apertures can be configured to be one combined beamlet-forming aperture. Pre-current limiting aperture array 305 illustrated in FIG. 8B may generate twenty-five beamlets, four combined beamlet-forming apertures and seventeen single beamlet-forming apertures.

The shape of each beamlet-forming aperture can be configured to reduce the size thereof, so that Coulomb interaction effects can be accordingly reduced. It is appreciated that the size of each beamlet-forming aperture can be reduced as much as possible to accordingly reduce Coulomb interaction effects as much as possible. Hence, shapes of beamlet-forming apertures can be the same or different from each other. Beamlet-forming apertures can be configured round, elliptical, in polygon, or in any other arbitrary shape.

Figure 9:
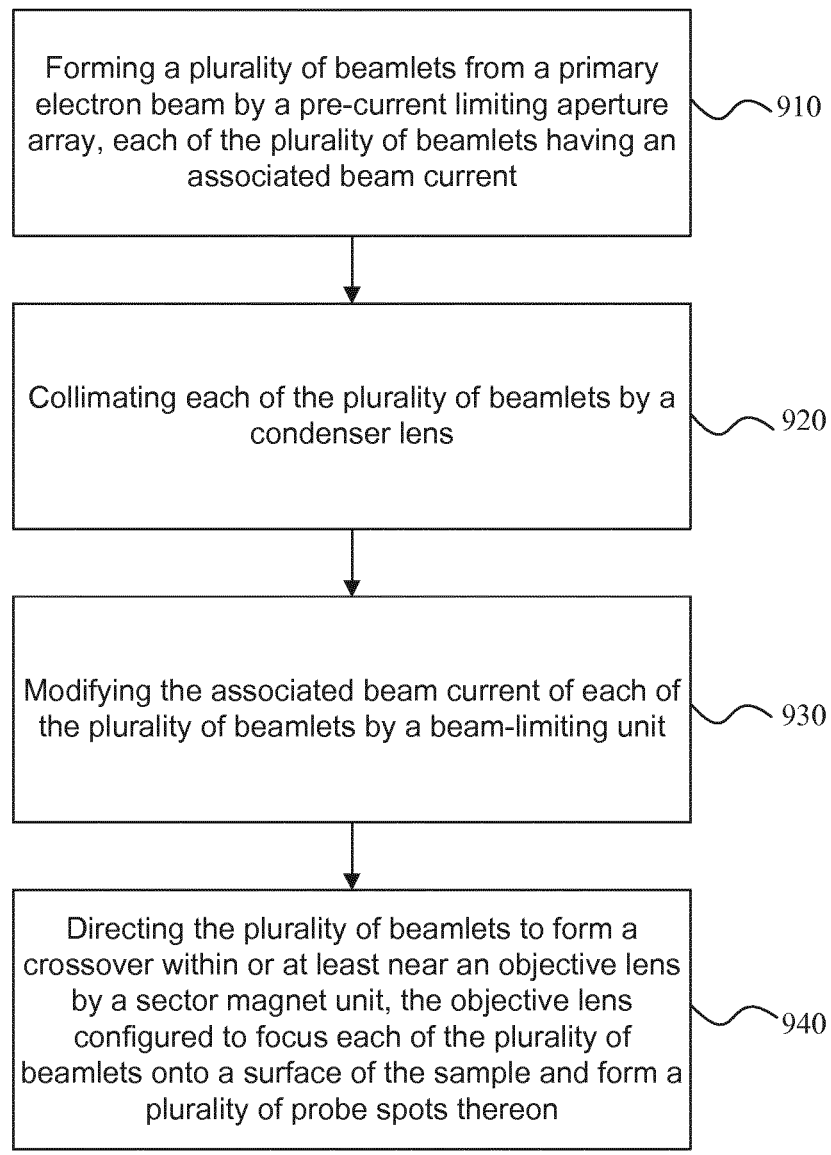
FIG. 9 is a flow chart showing an exemplary method of observing a sample using a multi-beam inspection system, consistent with embodiments of the present disclosure.

FIG. 9 is a process flow chart of an exemplary method of observing a sample using a multi-beam apparatus, consistent with embodiments of the present disclosure. The method of observing the sample may include forming multiple beamlets (e.g., primary beamlets 302_1a, 302_2a and 302_3a of FIG. 3), modifying the beamlets through sector magnets (e.g., sector magnetic unit 360 of FIG. 3) and detecting the secondary electrons generated by the modified beamlets incident on the sample.

In step 910, a pre-current limiting aperture array (e.g., pre-current limiting aperture array 305 of FIG. 3) may be configured to generate a plurality of primary beamlets from a divergent charged-particle beam (e.g., primary electron beam 302 of FIG. 3). The pre-current limiting aperture array may comprise a plurality of beamlet-forming apertures that may be uniform or non-uniform in shape, size, and cross-section. Each of the primary beamlets may have an associated beam current that can be adjusted by selecting the appropriate beamlet-forming aperture. In some embodiments, the radial size of the beamlet-forming apertures may be changed to modify the current associated with each beamlet.

The pre-current limiting aperture array may be configured to block off peripheral electrons and off-axial beam electrons of the primary electron beam to reduce Coulomb interaction effects. Coulomb interaction effects can enlarge the size of each of probe spots, and therefore deteriorate inspection resolution.

In step 920, a condenser lens (e.g., condenser lens 310 of FIG. 3) may be configured to collimate each of the divergent primary beamlets into substantially parallel electron beams. The condenser lens may comprise an electromagnetic lens to focus the beamlets. In some embodiments, the strength of the condenser lens may be fixed, and therefore the resolution may be adjusted using the pre-current limiting aperture array.

In step 930, the primary beamlets may enter a beam-limiting unit (e.g., beam limiting unit 320 of FIG. 3) configured to modify the primary beamlets by reducing the associated beam current of each of the primary beamlets. The beam-limiting unit may include one or more MEMS micro-lens arrays (e.g., micro-lens arrays 322 and 326 of FIGS. 3 and 4) and a current-limiting aperture array (e.g., current limiting aperture array 324 of FIG. 3). In some embodiments, the current limiting aperture array may be disposed between the first and the second micro-lens arrays. Alternatively, the current limiting aperture array may be disposed downstream of beam-limiting unit, between the second micro-lens array and a deflector array (e.g., deflector array 340 of FIG. 3).

The primary electron beamlets are inherently divergent; therefore the resultant beam spread can result in larger probe spots and poor spatial resolution during inspection or image acquisition. The beam-limiting unit may be further configured to modify the primary beamlets such that each of the primary beamlets converges in a focal plane perpendicular to the primary optical axis. The focal plane may also be referred to herein as the cross-over plane of each of the primary beamlets.

In some embodiments, each of the modified beamlets (e.g., primary modified beamlets 302_1m, 302_2m, and 302_3m of FIG. 3) may have a modified beamlet current that is lower than the primary associated beamlet current. The current limiting aperture array may comprise multiple apertures to further block peripheral electrons from the primary beamlets, forming modified beamlets with lower associated current. In some embodiments, the size of apertures of the current-limiting aperture array may be larger than the apertures of the pre-current limiting aperture array and smaller than the apertures of the first or the second micro-lens arrays.

The primary modified beamlets may be directed to a sector magnet (e.g., sector magnet unit 360 of FIG. 3) through the deflector array. The deflector array may be configured to deflect each of the modified beamlets into the sector magnet unit. The deflector array may be disposed in the cross-over plane perpendicular to the primary optical axis.

In step 940, the sector magnet unit may be configured to direct each of the primary modified beamlets by bending the beamlets towards an objective lens (e.g., objective lens assembly 380 of FIG. 3) such that a cross-over is formed within or at least near the objective lens. The angle of bending may be based on the configuration and layout of the objective lens and the sample surface with respect to the sector-magnet unit and primary optical axis. The objective lens may be configured to focus the individual modified beamlets on a sample surface (e.g., wafer 390 of FIG. 3).

The primary modified beamlets may form corresponding probe spots incident on the wafer and generate secondary electrons based on the interaction between the electrons in the beamlets and the wafer. The secondary electrons generated traverse a secondary beam path from the wafer to an electron detection device (e.g., electron detection device 440 of FIG. 4), passing through the sector magnet unit and a projection lens assembly (e.g., projection lens assembly 450 of FIG. 4). The sector magnet unit may be configured to separate the secondary beamlets (e.g., secondary beamlets 402_1b, 402_2b, and 402_3b of FIG. 4) comprising the secondary electrons, from the primary modified beamlets, therefore eliminating the need for a separate Wien filter.

The embodiments may further be described using the following clauses:

1. A multi-beam apparatus for observing a sample, comprising:
an electron source configured to generate a primary electron beam;
a pre-current limiting aperture array comprising a plurality of apertures and configured to form a plurality of beamlets from the primary electron beam, each of the plurality of beamlets having an associated beam current;
a condenser lens configured to collimate each of the plurality of beamlets;
a beam-limiting unit configured to modify the associated beam current of each of the plurality of beamlets; and
a sector magnet unit configured to direct each of the plurality of beamlets to form a crossover within or at least near an objective lens that is configured to focus each of the plurality of beamlets onto a surface of the sample and to form a plurality of probe spots thereon.

2. The multi-beam apparatus of clause 1, wherein the beam-limiting unit is further configured to focus each of the plurality of beamlets on a focal plane.

3. The multi-beam apparatus of any one of clauses 1 and 2, further comprising a beam-deflector array having a plurality of beam-deflectors disposed in the focal plane, wherein each of the plurality of beam deflectors is associated with a corresponding beamlet of the plurality of beamlets.

4. The multi-beam apparatus of clause 3, wherein each of the plurality of beam-deflectors comprises a multi-pole structure.

5. The multi-beam apparatus of any one of clauses 1-4, further comprising an electron detection device with a plurality of detection elements configured to detect a plurality of secondary electron beams generated from the plurality of probe spots on the sample.

6. The multi-beam apparatus of clause 5, wherein the sector magnet unit is further configured to direct the plurality of secondary electron beams generated from the plurality of probe spots to the electron detection device.

7. The multi-beam apparatus of any one of clauses 5 and 6, wherein the sector magnet unit is further configured to separate the plurality of beamlets incident on the surface of the sample from the plurality of secondary electron beams.

8. The multi-beam apparatus of any one of clauses 1-7, wherein the beam-limiting unit comprises:
a first micro-lens array comprising a first plurality of apertures;
a second micro-lens array comprising a second plurality of apertures; and
a current-limiting aperture array comprising a third plurality of apertures, wherein the third plurality of apertures are smaller in diameter than the first and the second plurality of apertures.

9. The multi-beam apparatus of clause 8, wherein the plurality of apertures of the pre-current limiting aperture array are smaller in diameter than the third plurality of apertures of the current-limiting aperture array.

10. The multi-beam apparatus of any one of clauses 8 and 9, wherein the current-limiting aperture array is disposed between the first and the second micro-lens arrays.

11. The multi-beam apparatus of any one of clauses 8-10, wherein the first and the second micro-lens arrays comprise one of micro-electromechanical systems (MEMS) optics or laser-machined optics.

12. The multi-beam apparatus of any one of clauses 1-11, wherein a ratio of modified beam current to the associated beam current of each of the plurality of beamlets is in the range of 2 to 200.

13. A multi-beam apparatus for observing a sample, comprising:
a beam-limiting unit configured to receive a plurality of beamlets generated from a primary electron beam, the beam-limiting unit comprising:
a first micro-lens array comprising a first plurality of apertures;
a second micro-lens array comprising a second plurality of apertures; and
a current-limiting aperture array comprising a third plurality of apertures that are smaller in diameter than the first and the second plurality of apertures.

14. The multi-beam apparatus of clause 13, further comprising a sector magnet unit configured to direct the plurality of beamlets to form a crossover within or at least near an objective lens, the objective lens configured to focus each of the plurality of beamlets onto a surface of the sample and form a plurality of probe spots thereon.

15. The multi-beam apparatus of any one of clauses 13 and 14, further comprising a pre-current limiting aperture array having a plurality of apertures and configured to form a plurality of beamlets from the primary electron beam, each of the plurality of beamlets having an associated beam current.

16. The multi-beam apparatus of clause 15, wherein the plurality of apertures of the pre-current limiting aperture array are smaller in diameter than the third plurality of apertures of the current-limiting aperture array.

17. The multi-beam apparatus of any one of clauses 15 and 16, wherein the beam-limiting unit is further configured to:
modify the associated beam current of each of the plurality of beamlets; and
focus each of the plurality of beamlets on a focal plane.

18. The multi-beam apparatus of any one of clauses 14-17, further comprising:

an electron source configured to generate the primary electron beam;

a condenser lens configured to collimate the plurality of beamlets; and an electron detection device with a plurality of detection elements configured to detect a plurality of secondary electron beams generated from the plurality of probe spots on the sample.

19. The multi-beam apparatus of any one of clauses 17-18, further comprising a beam-deflector array having a plurality of beam-deflectors disposed in the focal plane, wherein each of the plurality of beam deflectors is associated with a corresponding beamlet of the plurality of beamlets.

20. The multi-beam apparatus of clause 19, wherein each of the plurality of beam-deflectors comprises a multi-pole structure.

21. The multi-beam apparatus of any one of clauses 14-20, wherein the sector magnet unit is further configured to:
 direct a plurality of secondary electron beams generated from the plurality of probe spots to the electron detection device; and
 separate the plurality of beamlets incident on the surface of the sample from the plurality of secondary electron beams.

22. The multi-beam apparatus of any one of clauses 13-21, wherein the current-limiting aperture array is disposed between the first and the second micro-lens arrays.

23. The multi-beam apparatus of any one of clauses 13-22, wherein the first and the second micro-lens arrays comprise one of micro-electromechanical systems (MEMS) optics or laser-machined optics.

24. The multi-beam apparatus of any one of clauses 15-23, wherein a ratio of modified beam current to the associated beam current of each of the plurality of beamlets is in the range of 2 to 200.

25. A method of observing a sample using a multi-beam apparatus, the method comprising:
 forming, using a pre-current limiting aperture array, a plurality of beamlets from a primary electron beam, each of the plurality of beamlets having an associated beam current;
 collimating each of the plurality of beamlets;
 modifying, using a beam-limiting unit, the associated beam current of each of the plurality of beamlets; and
 directing, using a sector magnet unit, the plurality of beamlets to form a crossover within or at least near an objective lens, the objective lens configured to focus each of the plurality of beamlets onto a surface of the sample and form a plurality of probe spots thereon.

26. The method of clause 25, further comprising directing a plurality of secondary electron beams generated from the plurality of probe spots to an electron detection device by the sector magnet unit.

27. The method of any one of clauses 25 and 26, further comprising focusing each of the plurality of beamlets on a focal plane by the beam-limiting unit.

28. A non-transitory computer readable medium storing a set of instructions that is executable by one or more processors of a multi-beam apparatus to cause the multi-beam apparatus to perform a method to observe a sample, the method comprising:
 forming a plurality of beamlets from a primary electron beam by a pre-current limiting aperture array, each of the plurality of beamlets having an associated beam current;
 modifying the associated beam current of each of the plurality of beamlets by a beam-limiting unit;
 directing the plurality of beamlets to form a crossover within or at least near an objective lens by a sector magnet unit, the objective lens configured to focus each of the plurality of beamlets onto a surface of the sample and form a plurality of probe spots thereon; and
 directing a plurality of secondary electron beams generated from the plurality of probe spots to an electron detection device by the sector magnet unit, the electron detection device comprising a plurality of detection elements configured to detect the plurality of secondary electron beams.

29. The non-transitory computer readable medium of clause 28, wherein the set of instructions that is executable by the one or more processors of the multi-beam apparatus to cause the multi-beam apparatus to further perform:
 collimating the plurality of beamlets by a condenser lens; and
 focusing each of the plurality of beamlets on a focal plane by the beam-limiting unit.

30. A multi-beam apparatus for observing a sample, comprising:
 a pre-current limiting aperture array comprising a plurality of apertures and configured to form a plurality of beamlets from a primary electron beam, each of the plurality of beamlets having an associated beam current;
 a beam-limiting unit configured to modify the associated beam current of each of the plurality of beamlets; and
 a sector magnet unit configured to direct each of the plurality of beamlets to form a crossover within or at least near an objective lens that is configured to focus each of the plurality of beamlets onto a surface of the sample and to form a plurality of probe spots thereon.

31. The multi-beam apparatus of clause 5, wherein the sector magnet unit is disposed downstream of a crossover of the plurality of secondary electron beams.

32. The multi-beam apparatus of clause 5, wherein the sector magnetic unit is configured to: apply an adjustable magnetic force on the plurality of beamlets; and selectively deflect electrons in the plurality of secondary electron beams.

33. The multi-beam apparatus of clause 5, wherein the sector magnet unit is configured as an electromagnetic field lens.

A non-transitory computer readable medium may be provided that stores instructions for a processor to carry out image inspection, image acquisition, stage positioning, beam focusing, electric field adjustment, beam bending, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A multi-beam apparatus for observing a sample, comprising:
    an electron source configured to generate a primary electron beam;
    a pre-current limiting aperture array comprising a plurality of apertures and configured to form a plurality of beamlets from the primary electron beam, each of the plurality of beamlets having an associated beam current;
    a condenser lens configured to collimate each of the plurality of beamlets;
    a beam-limiting unit configured to modify the associated beam current of each of the plurality of beamlets; and
    a sector magnet unit configured to direct each of the plurality of beamlets to form a crossover within or at least near an objective lens that is configured to focus each of the plurality of beamlets onto a surface of the sample and to form a plurality of probe spots thereon.

2. The multi-beam apparatus of claim 1, wherein the beam-limiting unit is further configured to focus each of the plurality of beamlets on a focal plane.

3. The multi-beam apparatus of claim 2, further comprising a beam-deflector array having a plurality of beam deflectors disposed in the focal plane, wherein each of the plurality of beam deflectors is associated with a corresponding beamlet of the plurality of beamlets.

4. The multi-beam apparatus of claim 1, further comprising an electron detection device with a plurality of detection elements configured to detect a plurality of secondary electron beams generated from the plurality of probe spots on the sample, wherein the sector magnet unit is further configured to direct the plurality of secondary electron beams generated from the plurality of probe spots to the electron detection device.

5. The multi-beam apparatus of claim 4, wherein the sector magnet unit is further configured to separate the plurality of beamlets directed to the surface of the sample from the plurality of secondary electron beams.

6. The multi-beam apparatus of claim 5, wherein the sector magnet unit is disposed downstream of a crossover of the plurality of secondary electron beams.

7. The multi-beam apparatus of claim 5, wherein the sector magnetic unit is configured to: apply an adjustable magnetic force on the plurality of beamlets; and selectively deflect electrons in the plurality of secondary electron beams.

8. The multi-beam apparatus of claim 5, wherein the sector magnet unit is configured as an electromagnetic field lens.

9. The multi-beam apparatus of claim 1, wherein the beam-limiting unit comprises:
    a first micro-lens array comprising a first plurality of apertures;
    a second micro-lens array comprising a second plurality of apertures; and
    a current-limiting aperture array comprising a third plurality of apertures, wherein the third plurality of apertures are smaller than the first and the second plurality of apertures.

10. The multi-beam apparatus of claim 9, wherein the plurality of apertures of the pre-current limiting aperture array are smaller than the third plurality of apertures of the current-limiting aperture array.

11. The multi-beam apparatus of claim 9, wherein the current-limiting aperture array is disposed between the first and the second micro-lens arrays.

12. The multi-beam apparatus of claim 9, wherein the first and the second micro-lens arrays comprise one of micro-electromechanical systems (MEMS) optics or laser-machined optics.

13. The multi-beam apparatus of claim 1, wherein a ratio of modified beam current to the associated beam current of each of the plurality of beamlets is in a range of 2 to 200.

14. A non-transitory computer readable medium storing a set of instructions that is executable by one or more processors of a multi-beam apparatus to cause the multi-beam apparatus to perform a method to observe a sample, the method comprising:
    forming a plurality of beamlets from a primary electron beam by a pre-current limiting aperture array, each of the plurality of beamlets having an associated beam current;
    modifying the associated beam current of each of the plurality of beamlets by a beam-limiting unit;
    directing the plurality of beamlets to form a crossover within or at least near an objective lens by a sector magnet unit, the objective lens configured to focus each of the plurality of beamlets onto a surface of the sample and form a plurality of probe spots thereon; and
    directing a plurality of secondary electron beams generated from the plurality of probe spots to an electron detection device by the sector magnet unit, the electron detection device comprising a plurality of detection elements configured to detect the plurality of secondary electron beams.

15. The non-transitory computer readable medium of claim 14, wherein the method further comprises:
    collimating the plurality of beamlets by a condenser lens; and
    focusing each of the plurality of beamlets on a focal plane by the beam-limiting unit.

* * * * *